United States Patent
Hara et al.

(10) Patent No.: US 6,914,871 B2
(45) Date of Patent: Jul. 5, 2005

(54) MICRO MIRROR UNIT, OPTICAL DISC DRIVE USING SAME, AND METHOD FOR PRODUCING MICRO MIRROR UNIT

(75) Inventors: Masaki Hara, Kanagawa (JP); Kazuhito Hori, Kanagawa (JP); Hiroto Ido, Chiba (JP); Naoto Kojima, Kanagawa (JP); Kazuhiro Hane, Miyagi (JP)

(73) Assignee: Sony Corporation, Tokyo (JP)

( * ) Notice: Subject to any disclaimer, the term of this patent is extended or adjusted under 35 U.S.C. 154(b) by 895 days.

(21) Appl. No.: 09/750,007

(22) Filed: Dec. 27, 2000

(65) Prior Publication Data

US 2001/0017726 A1 Aug. 30, 2001

(30) Foreign Application Priority Data

Dec. 28, 1999 (JP) ............................................ P11-375337

(51) Int. Cl.⁷ .......................... G11B 7/135; G02B 26/08
(52) U.S. Cl. ................................ 369/112.29; 369/44.23; 385/16; 385/88; 359/298; 359/245; 359/295; 428/212; 430/323
(58) Field of Search .......................... 369/112.29, 44.23; 385/16, 88; 359/245, 295, 298, 833; 333/262; 428/212; 430/323; 216/66

(56) References Cited

U.S. PATENT DOCUMENTS

| | | | | |
|---|---|---|---|---|
| 4,600,934 A | * | 7/1986 | Aine et al. | 428/450 |
| 5,229,193 A | * | 7/1993 | Madono et al. | 428/212 |
| 5,454,906 A | * | 10/1995 | Baker et al. | 216/66 |
| 5,532,884 A | * | 7/1996 | Lee et al. | 359/833 |
| 5,578,976 A | * | 11/1996 | Yao | 333/262 |
| 5,872,880 A | * | 2/1999 | Maynard | 385/88 |
| 5,999,306 A | * | 12/1999 | Atobe et al. | 359/295 |
| 6,025,951 A | * | 2/2000 | Swart et al. | 359/245 |
| 6,212,151 B1 | * | 4/2001 | Heanue et al. | 385/16 |

* cited by examiner

*Primary Examiner*—Tan Dinh
*Assistant Examiner*—Kim-Kwok Chu
(74) *Attorney, Agent, or Firm*—Sonnenschein, Nath & Rosenthal LLP

(57) ABSTRACT

The hinge (13) should preferably be formed to have a higher resistance than ever against the pivoting of the mirror body (12) to effectively prevent the hinge (13) from being damaged. By adopting a suitable one of a variety of production steps as necessary, the hinge (13) can be formed more finely and with a higher precision and thus the micro mirror unit can be produced more easily in a shorter time. To this end, the hinge (13) is formed from a different material, such as $SiN_x$, from the mirror substrate material from which the frame (11) and mirror body (12) are formed.

5 Claims, 12 Drawing Sheets

MICRO MIRROR UNIT, OPTICAL DISC DRIVE USING SAME, AND METHOD FOR PRODUCING MICRO MIRROR UNIT

RELATED APPLICATION DATA

The present application claims priority to Japanese Application No. P11-375337 filed Dec. 28, 1999, which application is incorporated herein by reference to the extent permitted by law.

BACKGROUND OF THE INVENTION

1. Field of the Invention

The present invention relates to a micro mirror unit in which a micro mirror can be moved electrostatically, an optical disc drive using the micro mirror unit, and a method for producing the micro mirror unit.

2. Description of the Related Art

In the recent electro-mechanical field of industry, the techniques in the semiconductor producing processes, etc. are utilized to actively develop techniques called "MEMS (micro electro-mechanical system)" intended for providing a variety of micro mechanical elements. A mirror designed with such MEMS techniques to be extremely compact as a light reflecting mechanical element is called "micro mirror unit".

The micro mirror unit consists of a frame and a mirror body having a reflective surface. In the unit, the frame and mirror body are linked to each other by means of at least one hinge. The mirror body includes a portion formed from an aluminum (Al) layer for example and working as an electrode. Also, there is provided a pair of electrodes formed from an aluminum (Al) layer and opposite to the electrode-functional portion of the mirror body with an air gap between them.

In the micro mirror unit, voltages of different signs are alternately applied to the pair of aluminum-layer electrodes for developing opposite-directional electrostatic forces between the pair of electrodes and the electrode-functional portion of the mirror body to pivot the mirror body about the hinge to a tilted position in a selected direction.

In the above micro mirror unit, the mirror body and hinge are formed from a metal layer such as Al layer formed on a substrate as known from the disclosure in the Japanese Unexamined Patent Publication No. 7-287177 for example. More particularly, in the micro mirror unit, the surface of the metal layer formed on the substrate works as the mirror surface of the mirror body, and the hinge is formed from a similar metal layer to that of the mirror body.

In the micro mirror unit constructed as in the above, the mirror body and hinge are formed from a single metallic material, so that the micro mirror unit is advantageously easy to produce. However, since the micro mirror unit is adapted for the mirror body thereof to be pivotable about the hinge to a tilted position in a selected direction, the hinge will possibly be damaged due to a so-called metal fatigue as the mirror body is repeatedly pivoted.

To avoid the above problem, a micro mirror unit has been proposed in which a mirror substrate and hinge, being main parts of the mirror body, are built in an Si substrate material forming a frame and a metal layer is formed on the mirror substrate to provide a mirror surface (as in "Technical Digest of the 16$^{th}$ Sensor Symposium", 1998, pp. 167–170). Namely, in this micro mirror unit, the mirror substrate, hinge and frame are formed integrally with each other by a micro working of the single Si substrate material by the wet etching. Further in this micro mirror unit, the mirror substrate made of Si has a highly-doped layer formed therein for the mirror body to be electrostatically movable.

In the micro mirror unit in which the mirror substrate and hinge are built in the Si substrate material forming the frame, the hinge has a higher resistance against the pivoting of the mirror body than a one made of a metal and thus is not so easily damaged.

In the micro mirror unit constructed as in the above, however, since the hinge is formed from the Si substrate material forming the frame as in the above, the shape of the hinge is limited to the thickness of the Si substrate material. Also, since the micro working by the wet etching takes a very long time, the micro mirror unit having the frame, mirror substrate and hinge formed by the wet etching will be produced with a poor efficiency and with an increased cost.

Further, in the micro mirror unit, since the hinge is formed by micro working of the single Si substrate material by the wet etching, it cannot easily be formed more finely and with a high precision. That is, in case the hinge is formed by the wet etching, the hinge having desired micro dimensions cannot be formed with a high precision because of the limited precision of the wet etching in the micro working.

Recently, techniques for using a micro mirror unit as a micro-motion actuator in an optical disc drive have been proposed. For a micro mirror unit suitable for use as such a micro-motion actuator in the optical disc drive, the hinge thereof will be required to be formed to have a further micro structure. In the micro mirror unit, the mirror body is twisted and oscillated about the hinge when being pivoted as having been described in the above. Therefore, the accurate motion of the mirror body greatly depends upon the shape of the hinge, and the hinge should be worked more precisely to a desired shape so that the micro mirror unit can work accurately as a micro-motion actuator.

Accordingly, there has been demanded a micro mirror unit whose hinge can be formed further finely and with a high precision and having a novel structure suitable for use as a micro-motion actuation in an optical disc drive.

OBJECT AND SUMMARY OF THE INVENTION

It is therefore an object of the present invention to overcome the above-mentioned drawbacks of the prior art by providing a micro mirror unit whose hinge is resistant against pivoting of a mirror body for effective prevention thereof from being damaged and can be formed finely and with a high precision and which has such a structure as can be produced easily in a short time, an optical disc drive using the micro mirror unit, and a method for producing the micro mirror unit.

The above object can be attained by providing a micro mirror unit including a frame and a mirror substrate, formed from a single substrate material, the mirror body having a mirror surface thereof formed on the mirror substrate being linked to the frame by means of hinges in such a manner that the mirror body is supported movably in relation to the frame. The hinge of the micro mirror unit is formed from a different material from that from which the frame and mirror body are formed.

More specifically, the frame and mirror body in the micro mirror unit are formed from a single Si substrate material for example by a micro working. The hinges are formed from $SiN_x$, $SiO_2$, SiC or a composite material containing any of these materials and a metallic material for example.

Thus since in this micro mirror unit, the hinges are formed from a different material from that of the frame and mirror body, it will not be limited in shape to the thickness of the substrate material from which the frame and mirror substrate are formed. Therefore, in the micro mirror unit thus constructed, the shape can be set more freely.

Also, since the hinge in the micro mirror unit is formed from the above material, it will be more resistant against the pivoting of the mirror body for more effective prevention thereof from being damaged than a one formed from a metallic material.

Also, since the frame and mirror substrate can be formed to predetermined shapes, respectively, by micro working of a single substrate material by the wet etching, the micro mirror unit according to the present invention can be produced more efficiently in a shorter time than the conventional micro mirror unit of which the frame, mirror substrate and hinge are formed by micro working of a single substrate material by the wet etching.

Also, since the hinge in the micro mirror unit according to the present invention is formed more fine with a higher precision than the hinge formed by micro working of the single substrate material by the wet etching for the conventional micro mirror unit.

Also the above object can be attained by providing an optical disc drive in which a light is directed from a light source to an optical disc to thereby write and/or read information to and/or from the optical disc. The optical disc drive includes a micro mirror unit to reflect an incident light from the light source towards the optical disc. The micro mirror unit provided in the optical disc drive includes a frame and a mirror substrate, formed from a single substrate material, a mirror body consisting of the mirror substrate and a mirror surface formed on the substrate being linked to the frame by means of hinges formed from a different material from that of the frame and mirror substrate, and thus supported movably in relation to the frame. The position of the light incident upon the optical disc can be changed by moving the mirror body in the micro mirror unit.

That is, the optical disc drive is provided with the aforementioned micro mirror unit according to the present invention, and a light emitted from the light source is reflected by the micro mirror unit for incidence upon the optical disc.

Therefore, the position of the light incident upon the optical disc can appropriately be directed to a desired position on the optical disc by accurately controlling the motion of the mirror body of the micro mirror unit.

Also the above object can be attained by providing a method for producing a micro mirror unit including, according to the present invention, a frame and a mirror substrate, formed from a single substrate material, the mirror body having a mirror surface thereof formed on the mirror substrate being linked to the frame by means of hinges in such a manner that the mirror body is supported movably in relation to the frame. The method includes a first step at which a material for the hinges are formed as layer on one main side of a substrate material for the frame and mirror substrate, a second step at which a resist layer is formed on the other main side of the substrate material on which a mirror surface is formed, and a third step at which the frame and mirror substrate are separated from each other by the dry etching using the resist layer as a mask.

In this micro mirror unit producing method, a material different in selection ratio to etching from the substrate material is used as a material for the hinge formed as a layer on the one main side of the substrate material at the first step, the material for the hinges are dry-etched as an etching stopper at the third step or a material for the hinge different in selection ratio to etching from the substrate material is formed as a layer on the one main side of the substrate material at the first step, and a material different in selection ratio to etching from the substrate material is dry-etched as an etching stopper at the third step.

Also in this micro mirror unit producing method, the material for the hinge should preferably be formed as a layer by the plasma CVD process at the first step.

Also in the micro mirror unit producing method, the dry etching should preferably be effected by supplying $SF_6$ gas and $CF_4$ gas alternately as etching gases at the third step.

The aforementioned method for producing the micro mirror unit enables to set a shape of the hinge more freely without being limited by the thickness of the substrate material for the frame and mirror substrate as well as to form hinges having a micro shape with a high precision.

Also the micro mirror unit producing method permits to produce the micro mirror unit efficiently in a shorter time.

These objects and other objects, features and advantages of the present intention will become more apparent from the following detailed description of the preferred embodiments of the present invention when taken in conjunction with the accompanying drawings.

DETAILED DESCRIPTION OF THE PREFERRED EMBODIMENTS

Figure 1:
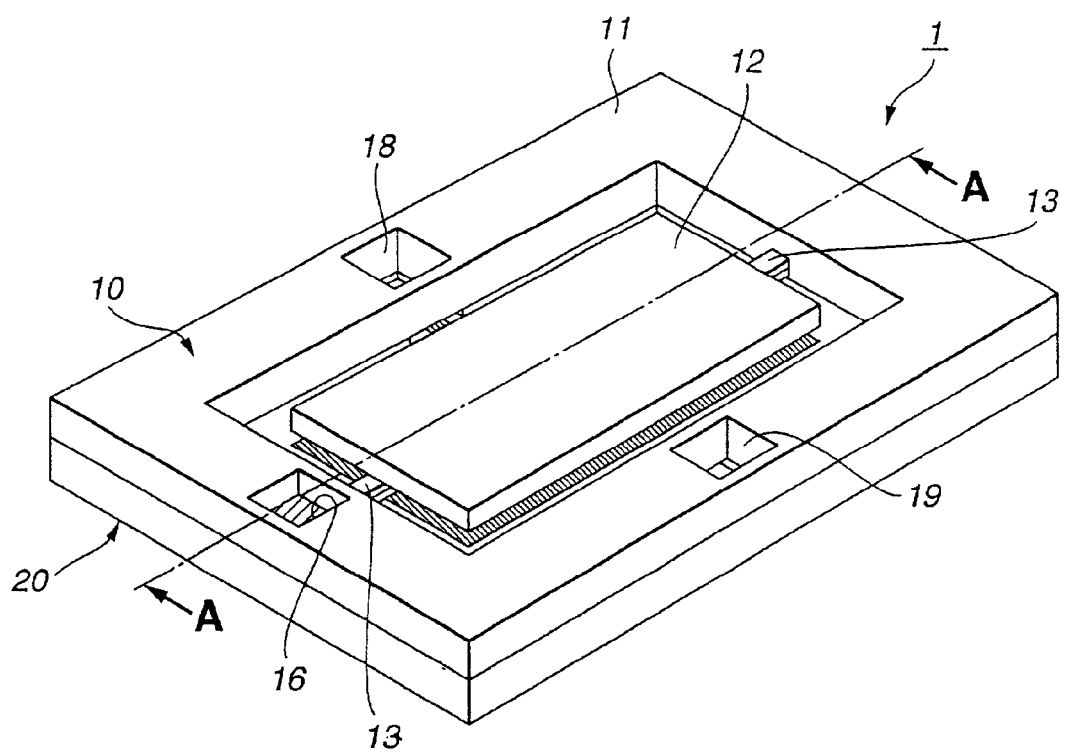
FIG. 1 is a perspective view of the micro mirror unit according to the present invention.
Figure 2:
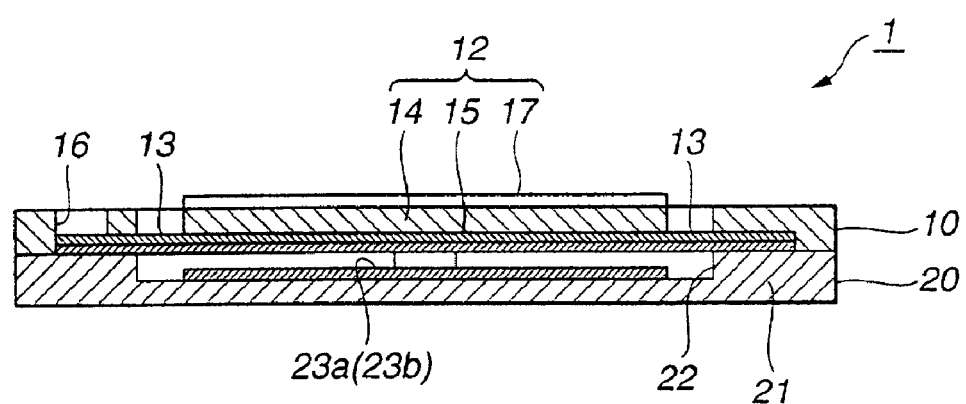
FIG. 2 is an axial sectional view, taken along the line A—A in FIG. 1, of the micro mirror unit according to the present invention.
Figure 3:
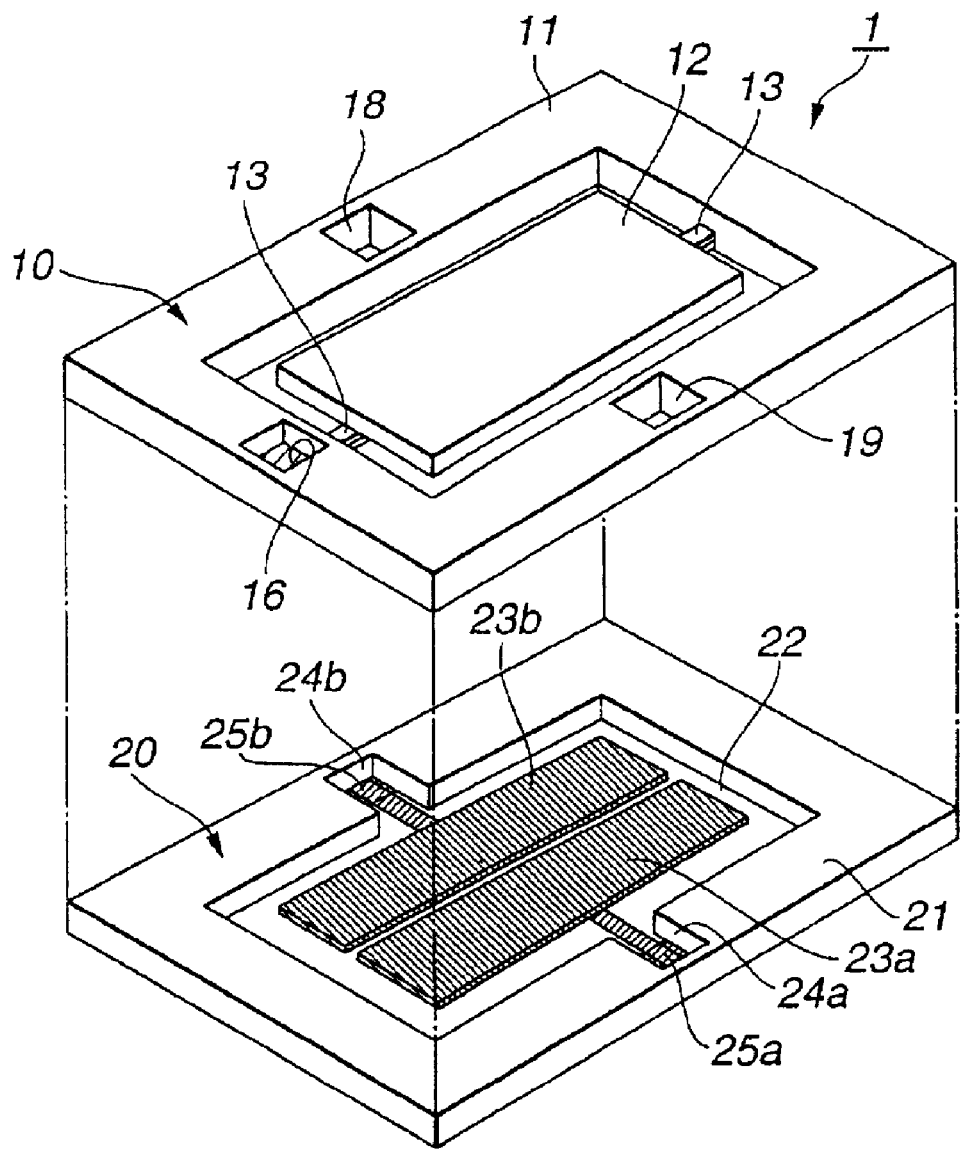
FIG. 3 is a perspective view of the micro mirror unit in FIG. 1, with the first and second blocks being separated from each other.

Referring now to FIGS. 1 to 3, there is schematically illustrated an embodiment of the micro mirror unit according to the present invention. The micro mirror unit is generally indicated with a reference 1, and it includes a first block 10 and second block 20, which are joined to each other by the anode bonding method or the like.

The fist block 10 includes a frame 11 formed from an Si substrate material to have the form of a ring opened at the center thereof by the dry etching, a mirror body 12 disposed in the central opening of the frame 11, and hinges 13 coupling the frame 11 and mirror body 12 to each other.

The mirror body 12 includes a mirror substrate 14 formed from the same Si substrate material as for the hinges 13 to have a predetermined form. That is, the mirror substrate 14 and frame 11 are formed from the single Si substrate material by the dry etching, and the central portion of the Si substrate material separated by the dry etching is used as the mirror substrate 14 while the peripheral portion is used as the frame 11.

The mirror substrate 14 has an electrode layer 15 formed on one main side thereof opposite to the second block 20. The electrode layer 15 is formed from an Al layer or the like formed on the one main side of the mirror substrate 14. That is, the electrode layer 15 is a metal layer such as an Al layer formed in a concavity formed in one main side of the Si substrate material which will be the mirror substrate 14.

In the micro mirror unit 1, a contact hole 16 is formed in the frame 11, extending through the frame 11 in the direction of the thickness of the latter. A voltage can be applied, through the contact hole 16, to the electrode layer 15 provided on the one main side of the mirror substrate 14.

A Cr/Au layer or the like is formed on the other main side of the mirror substrate 14, its surface being a mirror surface 17 to reflect light. That is, in the micro mirror unit 1, the mirror body 12 consists of the mirror substrate 14 formed from the same material as that of the frame 11, electrode layer 15 formed on the one main side of the mirror substrate 14, and the mirror surface 17 formed on the other main side of the mirror substrate 14.

The metal layer such as the Al layer being the electrode layer 15 of the mirror body 12 extends beyond each end of the mirror substrate 14 to the frame 11. Also, an $SiN_x$ layer is further formed on the metal layer being the electrode layer 15 of the mirror body 12. In the micro mirror unit 1, extensions of the mirror body 12 being a lamination of the metal layer and $SiN_x$ layer are the hinges 13 which linked the frame 11 and mirror body 12 to each other.

Namely, the hinges 13 are formed from the metal layer extending beyond the mirror body 12 and $SiN_x$ layer. The hinges 13 have one end thereof joined to the frame 11 and the other end joined to the mirror body 12 to link the frame 11 and mirror 12 to each other.

Note that the hinges 13 may be formed from an $SiO_2$ layer, SiC layer or the like instead of the $SiN_x$ layer. Also, the hinges 13 may be formed from a single layer such as an $SiN_x$ layer, $SiO_2$ layer, SiC layer or the like, not any lamination of the metal layer and $SiN_x$ layer, $SiO_2$ layer or SiC layer. In this case, the metal layer which will be the electrode layer 15 will be shaped correspondingly to the mirror substrate 14.

However, in case the hinges 13 are formed from a lamination of the metal layer and SiN$_x$ layer, SiO$_2$ layer or SiC layer, the hinges 13 will have a greater strength than the hinges 13 formed from a single layer such as the SiN$_x$ layer, SiO$_2$ layer or SiC layer.

The second block 20 includes a glass substrate 21 formed from a plate glass. The glass substrate 21 has formed on one main side thereof opposite to the first block 10 a concavity 22 shaped to match the mirror body 12 of the first block 10 and in which electrodes are to be formed. Namely, there are formed in the concavity 22 a pair of electrodes 23a and 23b opposite to the electrode layer 15 of the mirror body 12. The pair of electrodes 23a and 23b is formed from an Al layer or the like formed in the concavity 22.

Further, there are provided on the other main side of the glass substrate 21 opposite to the first block 10 concavities 24a and 24b communicating with the concavity 22 and in which there are formed lead-out pads 25a and 25b, respectively, electrically connected to the pair of electrodes 23a and 23b, respectively.

In the micro mirror unit 1, there are formed through the frame 11 at positions corresponding to the lead-out pads 25a and 25b of the frame 11 contact holes 18 and 19 extending in the direction of the thickness of the frame 11. voltages can be applied to the lad-out pads 25a and 25b and pair of electrodes 23a and 23b connected to the pads 25a and 25b, respectively, through the contact holes 18 and 19.

In the micro mirror unit 1 constructed as in the above, when voltages of different signs are applied to the pair of electrodes 23a and 23b, respectively, electrostatic forces opposite in direction to each other are developed between the pair of electrodes 23a and 23b and the electrode layer 15 of the mirror body 12. The electrostatic forces cause the mirror body 12 to pivot about the hinges 13 so that the mirror surface 17 of the mirror body 12 will be titled in a predetermined direction. The tilting of the mirror surface 17 can be controlled by controlling the voltage applied to the pair of electrodes 23a and 23b.

Figure 4:
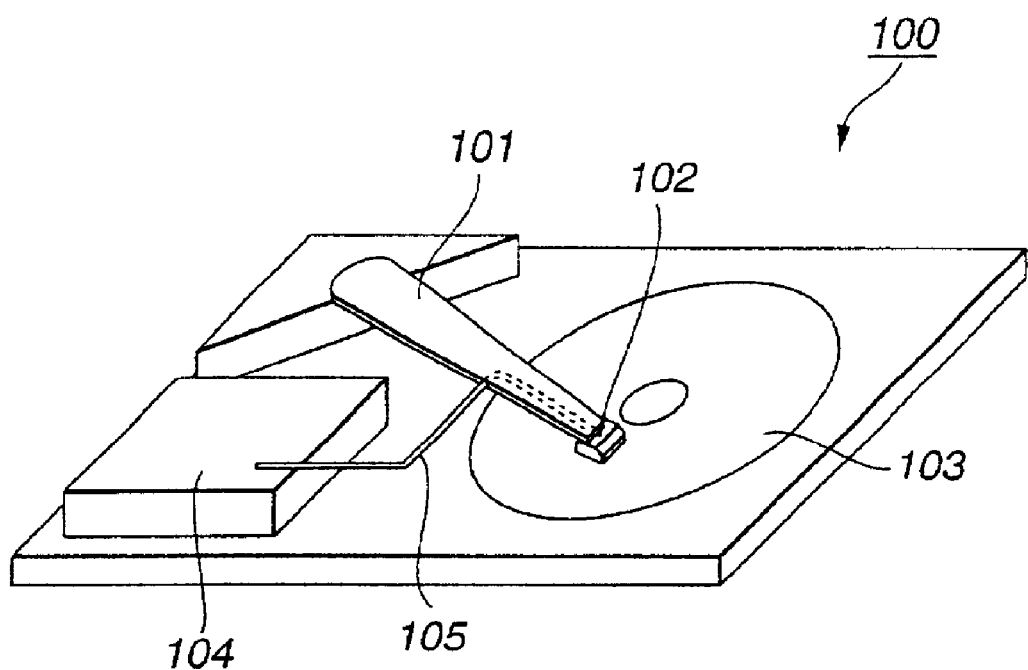
FIG. 4 is a schematic perspective view of the optical disc drive having the micro mirror unit installed therein.
Figure 5:
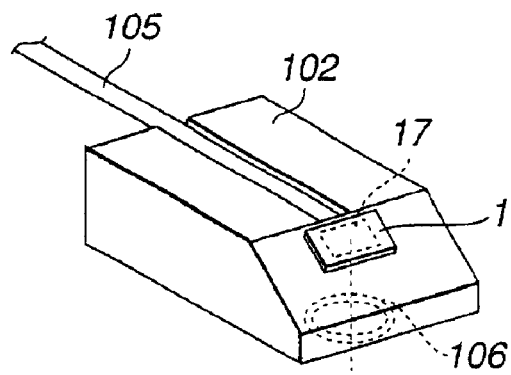
FIG. 5 is a perspective view, enlarged in scale, of the head slider and its associated portions, of the optical disc drive.

Thus, since the mirror surface 17 can be tilted to a selected angle, the micro mirror unit 1 can be used as a micro-motion actuator in an optical disc drive for example. An example of the optical disc drive provided with the micro mirror unit 1 as the micro-motion actuator is shown in FIGS. 4 and 5.

The optical disc drive is generally indicated with a reference 100. This optical disc drive 100 employs the technology of the hard disc drive. In the optical disc drive 100, a head slider 102 installed to a free end of an arm 101 is levitated over an optical disc 103 to write and/or read a signal to and/or from the optical disc 103. The head slider 102 has the micro mirror unit 1 installed thereon. A laser light guided from a light switching module 104 to the head slider 102 via an optical fiber 105 is reflected by the mirror surface 17 of the micro mirror unit 1 onto the signal recording surface of the optical disc 103 through an objective lens 106.

In the optical disc drive 100, the focused spot position of the laser light incident upon the signal recording surface of the optical disc 103 through the objective lens 106 is controlled by controlling the tilting of the mirror surface 17 of the micro mirror unit 1. Thus, the laser spot can be servo-controlled. In the optical disc drive 100, a course-motion actuator to oscillate the arm 101 and the micro mirror unit 1 as the micro-motion actuator form together a two-motion actuator which can provide a more accurate servo control.

More specifically, for the micro mirror unit 1 according to the present invention, since the hinges 13 are formed from a different material from that of the frame 11 and mirror substrate 14, a variety of production steps for the micro mirror unit 1, which will further be described later, can selectively be employed. For example, the hinges 13 may be formed by the dry etching, not by the wet etching. Therefore, the hinges 13 can be shaped to micro dimensions with a high precision for the micro mirror unit 1 which will show a high performance as the optical disc micro-motion actuator.

The frame 11 and mirror substrate 14 of the micro mirror unit 1 are formed from an Si substrate material which is chemically stable and has an excellent flatness as a thick substrate material, while the hinges 13 are formed from an SiN$_x$ layer or the like which is difficult to be thick but excellent in mechanical strength and chemical stability. Thus, making the most of the advantages of the respective materials, the hinges 13 can be made sufficiently resistant against the motion of the mirror body 12, which will permit to produce the micro mirror unit as a whole easily and appropriately.

The process of producing the micro mirror unit 1 constructed as having been described in the foregoing will be described. Note that the process of producing the micro mirror unit 1, which will be describe herebelow, is just an example and that the dimensions and materials of the components of the micro mirror unit 1 and methods for making the components are appropriately changed as necessary.

Figure 6:
FIG. 6 is a sectional view for explanation of the process for producing the micro mirror unit, showing a step at which an Si substrate material is in its initial state.

At a step, shown in FIG. 6, of the process of producing the micro mirror unit 1, there is first prepared an Si substrate material 30 having a length and width each of about 1 mm and a thickness of about 200 $\mu$m for example. The Si substrate material 30 should be a one having both main sides thereof polished with a high precision and having an accurately controlled thickness.

Figure 7:
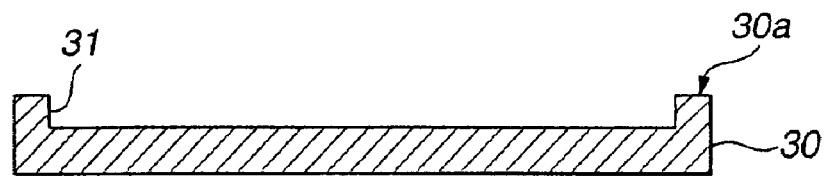
FIG. 7 is a sectional view explaining the micro mirror unit producing process, showing a step at which a concavity is formed in the Si substrate material in FIG. 6.

At a step shown in FIG. 7, a concavity 31 is formed in one 30a of the main sides of the Si substrate material 30 by the dry etching using a mask. The concavity 31 is shaped to match the shape of an assembly of the mirror body 12 and hinges 13 when the micro mirror unit 1 is finally completed.

Figure 8:
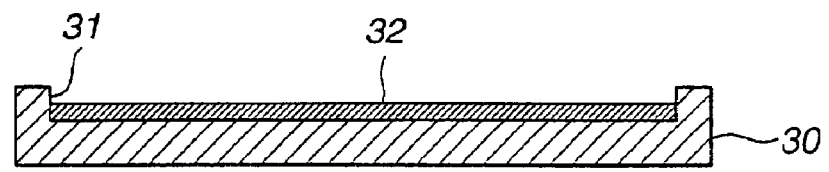
FIG. 8 is a sectional view explaining the micro mirror unit producing process, showing a step at which an aluminum layer (Al) is formed on the bottom of the concavity formed in the Si substrate material in FIG. 7.

Then at a step shown in FIG. 8, the evaporation process or the like is used to form an Al layer 32, which will form the electrode layer 15 of the mirror 12 and hinges 13 when the micro mirror unit 1 is finally completed, to a thickness of 200 nm for example in the concavity 31 formed in the Si substrate material 30.

Figure 9:
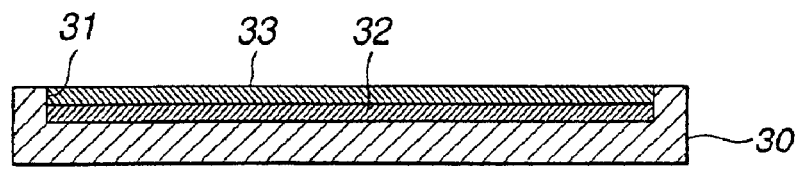
FIG. 9 is a sectional view explaining the micro mirror unit producing process, showing a step at which an $SiN_x$ layer is formed on the Al layer on the concavity bottom of the Si substrate material in FIG. 8.

Next at step shown in FIG. 9, the plasma enhanced CVD (chemical vapor deposition) process is used to form an SiN$_x$ layer 33, which will form together with the Al layer 32 the hinges 13 when the micro mirror unit 1 is finally completed, to a thickness of about 1.0 $\mu$m for example on the Al layer 32 formed in the concavity 31 in the Si substrate material 30.

If the SiN$_x$ layer 33 is formed at a high temperature by the depressurized CVD process or the like for example, too large a residual stress developed in the SiN$_x$ layer 33 thus formed will possibly cause the SiN$_x$ layer 33 to warp. In this case, it will be difficult for the hinges 13 to appropriately support and stably oscillate the mirror body 12. Therefore, the SiN$_x$ layer 33 should preferably be formed by the plasma CVD process or the like which enables to form such a layer at a relatively low temperature.

Figure 10:
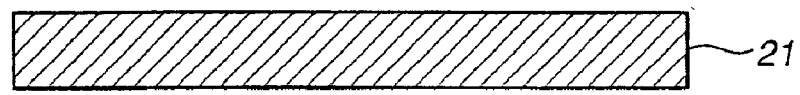
FIG. 10 is a sectional view explaining the micro mirror unit producing processing, showing a step at which a glass substrate is in its initial state.

Next at a step shown in FIG. 10, a glass substrate 21 is prepared which has the same dimensions as the Si substrate material 30, that is, has a length and width each of about 1 mm and a thickness of about 200 $\mu$m.

Figure 11:
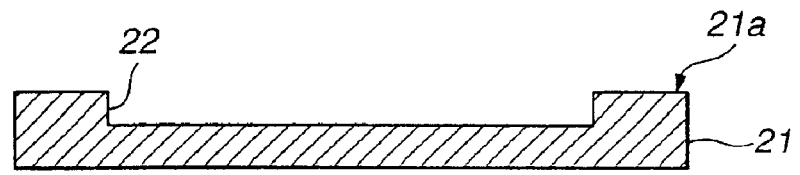
FIG. 11 is a sectional view explaining the micro mirror unit producing process, showing a step at which the glass substrate in FIG. 10 has formed therein a concavity in which electrodes are to be formed.

At a step shown in FIG. 11, there are formed in the one main side 21a of the glass substrate 21 a concavity 22 in which the electrodes 23a and 23b are to be formed and concavities 24a and 24b in which the pads 25a and 25b are to be formed, all about 10 μm in depth, by the wet etching using HF or the like.

Figure 12:
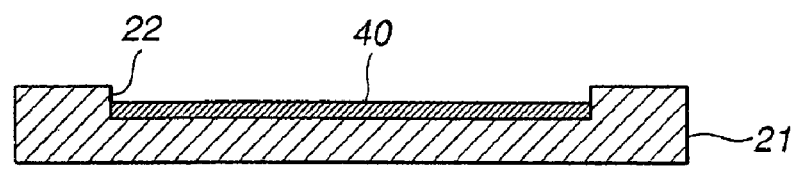
FIG. 12 is a sectional view explaining the micro mirror unit producing process, showing a step at which there is formed in the concavity in the glass substrate in FIG. 11 an Al layer from which a pair of electrodes are to be formed.

Next at a step shown in FIG. 12, the evaporation process or the like is used to form an Al layer 40, which will be the pair of electrodes 23a and 23b and lead-out pads 25a and 25b, to a thickness of about 200 nm for example in the concavity 22 and concavities 24a and 24b, respectively, formed in the glass substrate 21.

Figure 13:
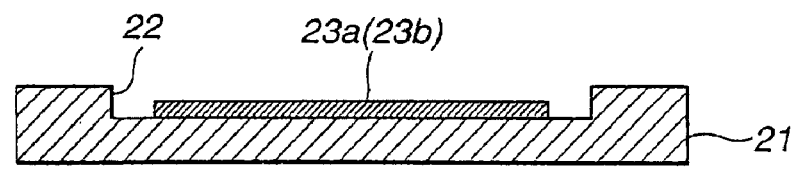
FIG. 13 is a sectional view explaining the micro mirror unit producing process, showing a step at which a pair of electrodes is formed by patterning the Al layer in FIG. 12.

At a step shown in FIG. 13, the reactive ion etching (RIE) or the like is used to pattern the Al layer 40 to a predetermined shape to form the pair of electrodes 23a and 23b and lead-out pads 25a and 25b. The pair of electrodes 23a and 23b and lead-out pads 25a and 25b are shaped as a rectangle having a length of 500 μm and width of 230 μm for example.

Figure 14:
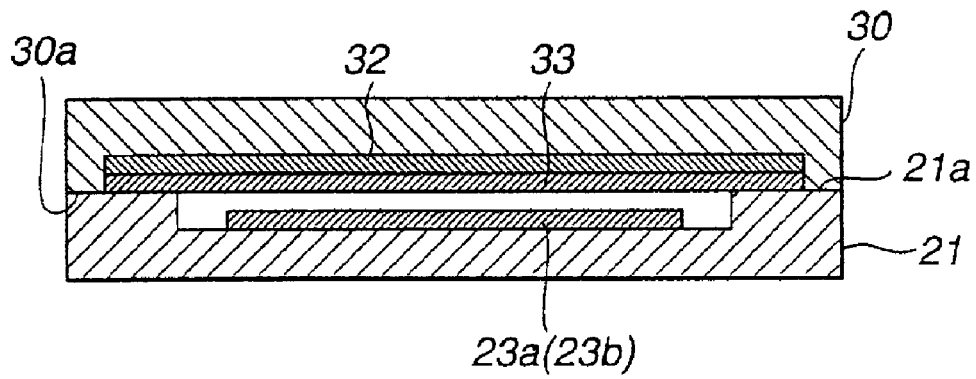
FIG. 14 is a sectional view explaining the micro mirror unit producing process, showing a step at which the Si substrate material in FIG. 9 is joined to the glass substrate in FIG. 13.

Next at a step shown in FIG. 14, the glass substrate 21 having the pair of electrodes 23a and 23b and lead-out pads 25a and 25b formed thereon as shown in FIG. 13, and the Si substrate material 30 having the Al layer 32 and $SiN_x$ layer 33 formed thereon as shown in FIG. 9, are butted at their respective main sides 21a and 30a to each other, and thus joined to each other by the anode bonding or the like.

Figure 15:
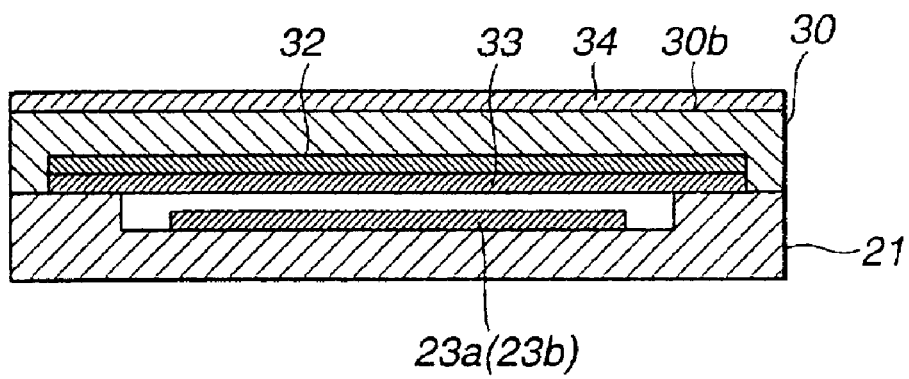
FIG. 15 is a sectional view explaining the micro mirror unit producing process, showing a step at which there is formed on the Si substrate material in FIG. 14 a Cr/Au layer which is to be a mirror surface is formed.

Then at a step shown in FIG. 15, the evaporation process or the like is used to form on the other main side 30b of the Si substrate material 30 joined to the glass substrate 21 a Cr/Au layer 34 of about 10/100 nm in thickness, respectively, which will be the mirror surface 17 of the mirror body 12 when the micro mirror unit 1 is finally completed. The Cr layer is provided to enhance the adhesion of the Au layer to the Si substrate material 30, and the surface of the Au layer serves as the mirror surface 17.

Figure 16:
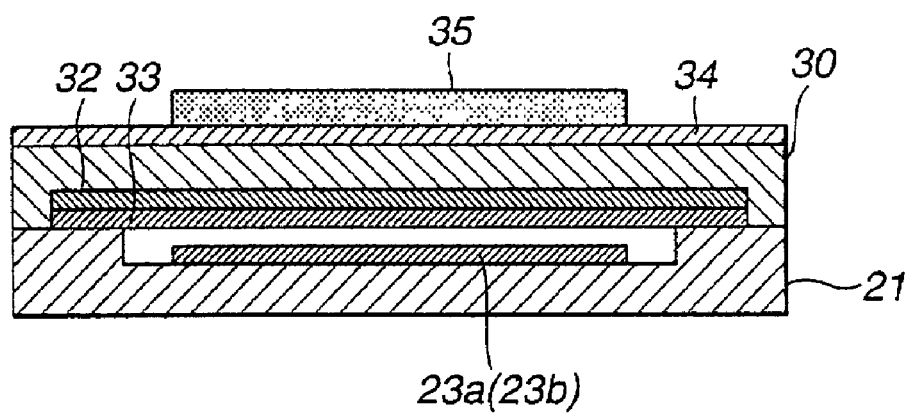
FIG. 16 is a sectional view explaining the micro mirror unit producing process, showing a step at which a resist pattern is formed on the Cr/Au layer in FIG. 15.

At a step shown in FIG. 16, the photolithography is used to form a resist pattern 35 on the Cr/Au layer 34 formed on the other main side 30b of the Si substrate material 30. The resist pattern 35 is used as a mask to shape the Cr/Au layer 34 correspondingly to the mirror body 12 to provide the mirror surface 17.

Figure 17:
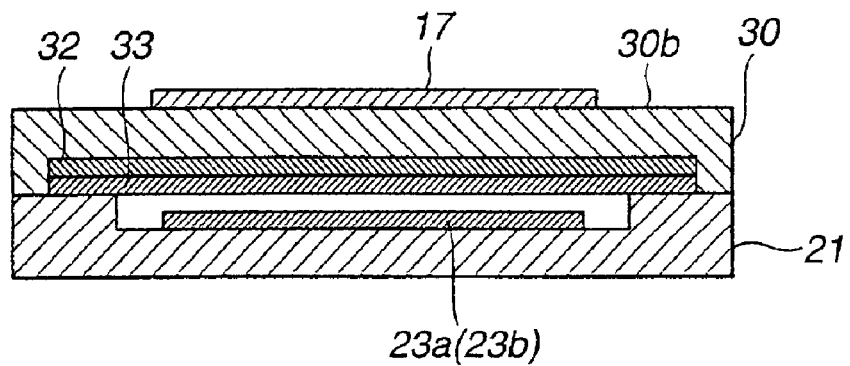
FIG. 17 is a sectional view explaining the micro mirror unit producing process, showing a step at which a mirror surface is formed by dry etching of the Cr/Au layer in FIG. 16 with the resist layer being used as a mask.

Next, the resist pattern 35 is used as a mask to etch the Cr/Au layer 34 by the RIE or the like, thereby forming the mirror surface 17 having a length and width each of about 500 μm for example on the other main side 30b of the Si substrate material 30 as shown in FIG. 17. Note that $C_2Cl_2F_4$ gas or the like is used as an etching gas at this time.

Figure 18:
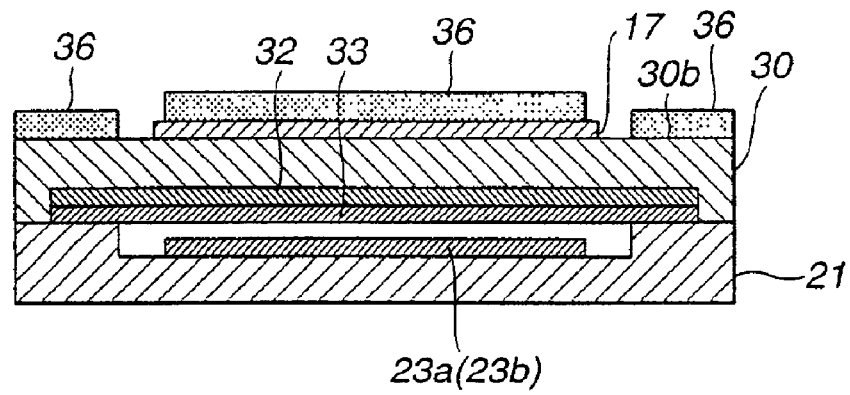
FIG. 18 is a sectional view explaining the micro mirror unit producing process, showing a step at which a resist pattern is formed on the Si substrate material having the mirror surface formed therein as in FIG. 17.

At a step shown in FIG. 18, the photolithography is used to form a resist pattern 36 on the other main side 30b of the Si substrate material 30 on which the mirror surface 17 is formed. The resist pattern 36 is used as a mask to shape the Si substrate material 30 correspondingly to the frame 11 and mirror substrate 14 which are to be separated from each other.

Next, the resist pattern 36 is used to etch the Si substrate material 30 by the so-called Bosch process, thereby forming the frame 11 and mirror substrate 14.

The Bosch process is such that as the etching gas, an $SF_6$ gas and $CF_4$ gas are alternately supplied for about 10 seconds to effect the dry etching. In this Bosch process, when the $SF_6$ gas is supplied, the etching progresses and a residue produced when the $CF_4$ gas is supplied will adhere to the wall surface of a portion thus etched. Namely, the etching progresses while the wall surface of the etched portion is being covered with the residue. Therefore, the dry etching of the Si substrate material 30 using the Bosch process will enable an etching at a high aspect ratio, and will inhibit side etching so that the Si substrate material 30 can be etched nearly vertically in the direction of its thickness.

In the process of producing the micro mirror unit 1, the Si substrate material 30 will be etched at a high speed but the Al layer 32 formed on the other main side 30b of the Si substrate material 30 will be little etched. Therefore, when the Si substrate material 30 has been etched in the direction of its thickness to the Al layer 32, the etching will end. Namely, the Al layer 32 will function as an etching stopper at this step.

Figure 19:
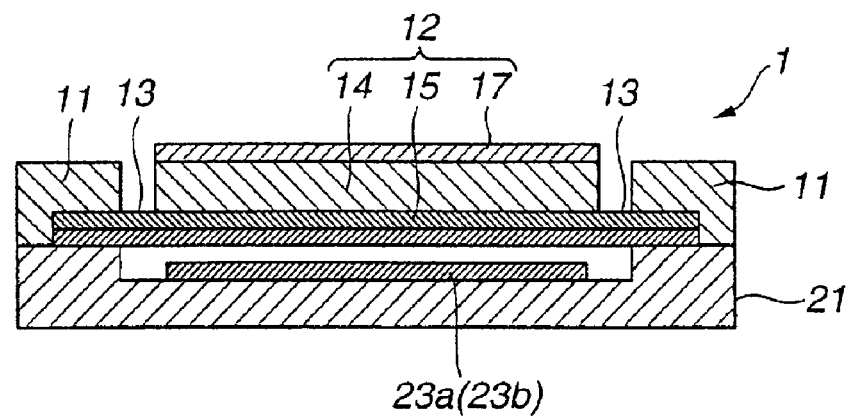
FIG. 19 is a sectional view explaining the micro mirror unit producing process, showing a step at which the micro mirror unit is completed by dry etching of the Si substrate material in FIG. 18 with the resist pattern being used as a mask.

When the dry etching of the Si substrate material 30 is done by the Bosch process or the like with the Al layer 32 being as the etching stopper, the frame 11 and mirror substrate 14 are formed separately as shown in FIG. 19 and the micro mirror unit 1 is completed. The portions of the Al layer 32 and $SiN_x$ layer 33, exposed outside when the frame 11 and mirror substrate 14 are separated from each other, become the hinges 13 which link the frame 11 and mirror substrate 14 to each other. The hinges 13 are formed to have a length of about 50 μm, width of about 20 μm and thickness of about 1.2 μm for example. Also the portion of the Al layer 32 lying on the main side of the mirror substrate 14 become the electrode layer 15, and the electrode layer 15, mirror substrate 14 and mirror surface 17 form together the mirror body 12. Note that the mirror substrate 14 is formed to have a length and width each of about 500 μm and a thickness of about 20 μm.

The aforementioned process of producing the micro mirror unit 1 is advantageous as will be described below:

First, since the frame 11 and mirror substrate 14 are formed from the Si substrate material 30 whose both sides are polished with a high precision, the thickness of each of them will be accurately controllable to a desired value. Also, since the Si substrate material 30 is excellent in chemical stability and workability, the frame 11 and mirror substrate 14 can be formed very easily. Furthermore, the Si substrate material 30 is available at a relatively low cost.

Also, since the hinges 13 are formed from $SiN_x$ or the like which is superior in mechanical strength to Si and excellent in chemical stability, the hinges 13 will have a high resistance against the motion of the mirror body 12 can be assured. Since $SiN_x$ is difficult to be formed into a monocrystal sheet like Si, it can effectively be used in combination with the Si substrate material 30. In the aforementioned process, since the Si substrate material 30 and $SiN_x$ layer 33 are used in combination and the frame 11 and mirror substrate 14 are formed from the Si substrate material 30 while the hinges 13 are formed from the $SiN_x$ layer or the like, namely, since the components of the micro mirror unit 1 are formed from different materials, it is possible to make the most of the advantages of the respective materials and produce the micro mirror unit 1 having an excellent performance.

As in the above, a variety of production processes can selectively be adopted because different materials are used in combination. For example, the hinges 13 can be formed, and the frame 11 and mirror substrate 14 can be separated from each other, by the dry etching, not by the wet etching. Therefore, this process enables to shape the hinges 13 to micro dimensions with a high precision as well as to produce the micro mirror unit 1 in a shorter time and with a higher efficiency than the formation of the components by the wet etching.

Further, this process makes it possible to form the hinges 13 without being limited by the thickness or the like of the Si substrate material 30 from which the frame 11 and mirror substrate 14 are to be formed, and thus form the hinges 13 to have a relatively free shape.

In the foregoing, the micro mirror unit 1 having the hinges 13 formed from the lamination of the $SiN_x$ layer or the like with the metal layer has been described. According to the present invention, however, the nearly same process as the production process for the aforementioned micro mirror unit 1 can be adopted to produce a micro mirror unit having the hinges 13 formed from an n-type poly-Si layer in which phosphorus (P) is doped. In this micro mirror unit, since the n-type poly-Si layer having phosphorus (P) doped therein from which the hinges 13 are formed will function as the electrode layer 15 of the mirror body 12 in the aforementioned micro mirror unit 1, the metal layer such as the Al layer which will become the electrode layer 15 may not be formed. However, since the metal layer such as the Al layer for the electrode layer 15 is used as the etching stopper in the process of producing the aforementioned micro mirror unit 1, an $SiO_2$ layer or the like has to be formed, instead of the metal layer such as the Al layer, as an etching stopper.

Figure 20:
FIG. 20 is a sectional view explaining a process for production of another micro mirror unit, showing a step at which an Si substrate material is in its initial state.

The process of producing the micro mirror unit having the hinges 13 formed from the n-type poly-Si layer having phosphorus (P) doped therein, will be described herebelow:

In this micro mirror unit producing process, at a first step shown in FIG. 20, there is prepared an Si substrate material 50 whose both sides are polished with a high precision and whose thickness is thus accurately controlled.

Figure 21:
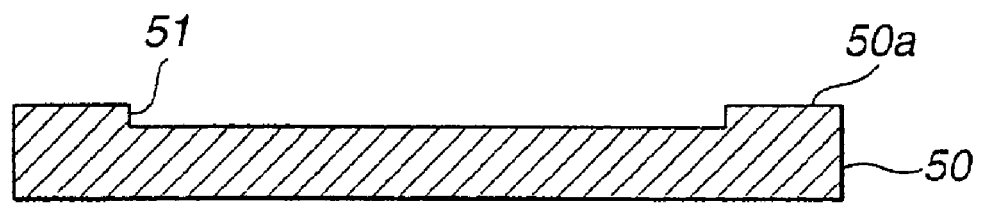
FIG. 21 is a sectional view explaining the process for production of another micro mirror unit, showing a step at which a concavity is formed in the Si substrate material in FIG. 20.

At a next step shown in FIG. 21, the dry etching or the like using a mask is used to form a concavity 50 in one 50a of the main sides of the Si substrate material 50. The concavity 51 is shaped to match the mirror body 12 when the micro mirror unit 1 is finally completed.

Figure 22:
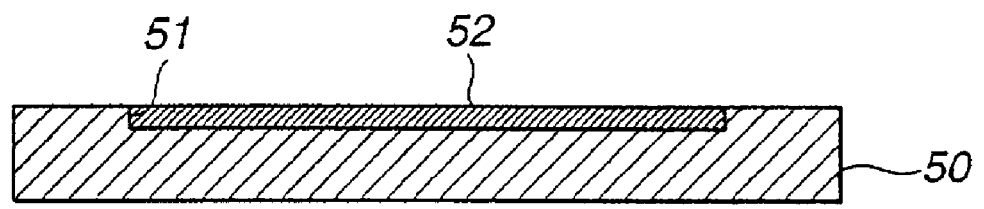
FIG. 22 is a sectional view explaining the process for production of another micro mirror unit, showing a step at which an $SiO_2$ layer is formed on the bottom of the concavity in FIG. 21.

At a step shown in FIG. 22, the evaporation process or the like is used to form an $SiO_2$ layer 52 to a thickness of about 100 nm for example in the concavity 51 formed in the Si substrate material 50. The $SiO_2$ layer 52 is to be used as an etching stopper when the Si substrate material 50 is dry-etched at a later step.

Figure 23:
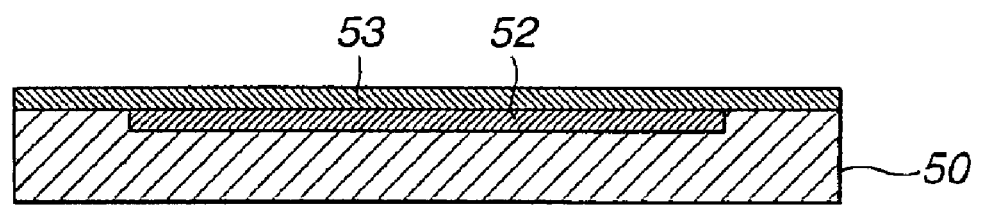
FIG. 23 is a sectional view explaining the process for production of another micro mirror unit, showing a step at which a doped Si layer is formed on the $SiO_2$ layer formed on the Si substrate material in FIG. 22.

At a next step shown in FIG. 23, the plasma CVD process is used to form an n-type poly-Si layer 53 having phosphorus (P) doped therein (will be referred to as "doped Si layer" hereinafter) to a thickness of 0.5 μm for example on the Si substrate material 50 on which the $SiO_2$ layer 52 has been formed. When the micro mirror unit 1 is finally completed, and the doped Si layer 53 is activated. The hinges 13 will be formed from the doped Si layer 53.

Next, the pair of electrodes 23a and 23b and lead-out pads 25a and 25b are formed on the glass substrate 21 through the same process as the aforementioned production process for the micro mirror unit 1. Note that since the steps of forming on the glass substrate 21 the pair of electrodes 23a and 23b and lead-out pads 25a and 25b are identical to those in the production process for the micro mirror unit 1, they will not be illustrated and described any longer.

Figure 24:
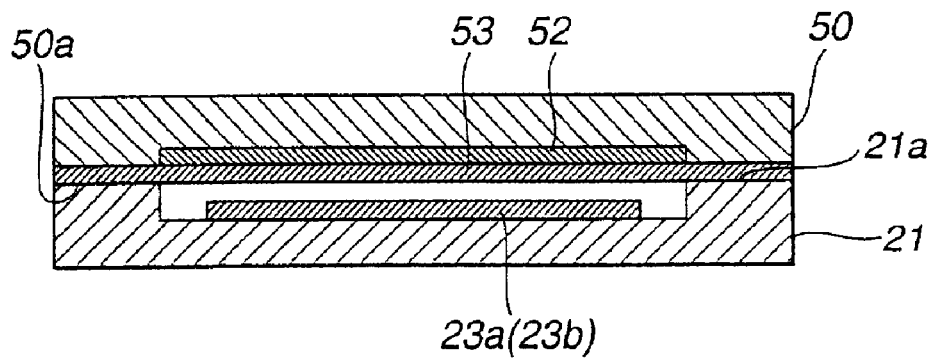
FIG. 24 is a sectional view explaining the process for production of another micro mirror unit, showing a step at which the Si substrate material in FIG. 13 is joined to the glass substrate in FIG. 23.

Next at a step shown in FIG. 24, the glass substrate 21 having formed thereon the pair of electrode 23a and 23b and lead-out pads 25a and 25b and the Si substrate material 50 having formed therein the $SiO_2$ layer 52 ad doped Si layer 53, are butted at their respective main sides 21a and 50a to each other, and thus joined to each other by the anode bonding or the like.

Figure 25:
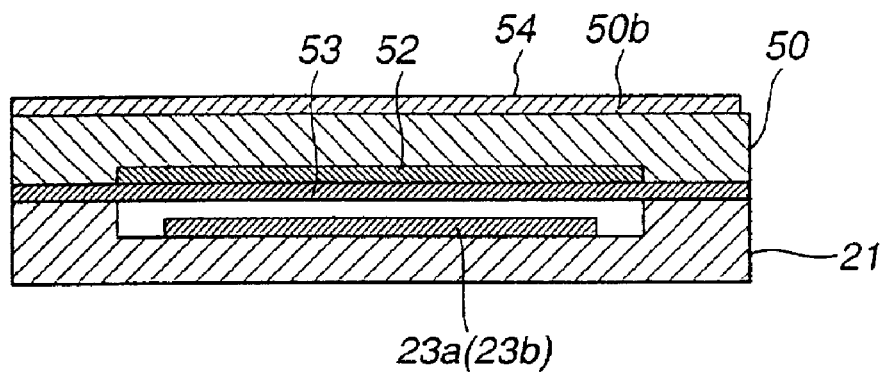
FIG. 25 is a sectional view explaining the process for production of another micro mirror unit, showing a step at which an Al layer which is to be a mirror surface is formed on the Si substrate in FIG. 24.

At a step shown in FIG. 25, the evaporation process or the like is used to form an Al layer 54 to a thickness of about 200 nm on the other main side 50b of the Si substrate material 50 joined to the glass substrate 21. The Al layer 54 will become the mirror surface 17 of the mirror body 12 when the micro mirror unit 1 is finally completed.

Figure 26:
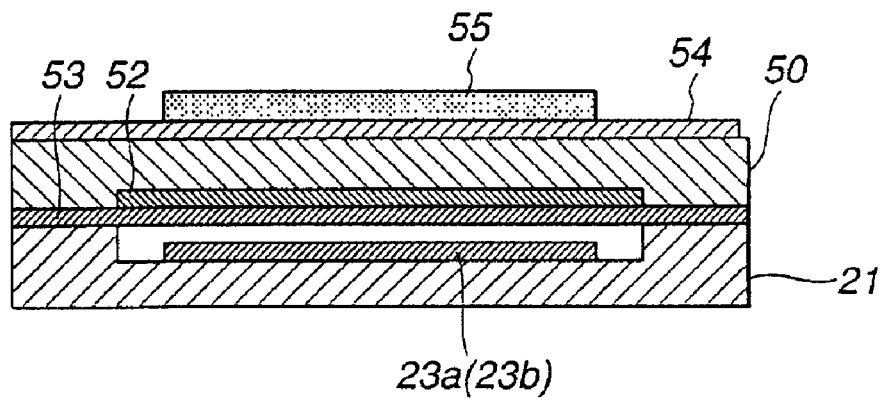
FIG. 26 is a sectional view explaining the process for production of another micro mirror unit, showing a step at which a resist pattern is formed on the Al layer in FIG. 25.

Then at a step shown in FIG. 26, the photolithography is used to form a resist pattern 55 on the Al layer 54 formed on the other main side 50b of the Si substrate material 50. The resist pattern 55 will be used as a mask to shape the Al layer 54 correspondingly to the shape of the mirror body 12 and thus provide the mirror surface 17.

Figure 27:
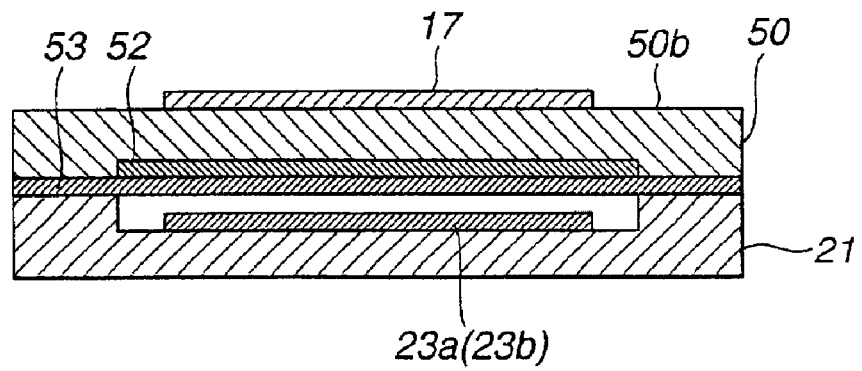
FIG. 27 is a sectional view explaining the process for production of another micro mirror unit, showing a step at which a mirror surface is formed by dry etching of the Al layer in FIG. 26 with the resist pattern being used as a mask

Next, the resist pattern 55 is used as a mask to etch the Al layer 54 by the RIE or the like, thereby forming the mirror surface 17 having a length and width each of about 500 μm for example on the other main side 50b of the Si substrate material 50 as shown in FIG. 27. Note that $BCl_3$ gas or the like is used as an etching gas at this time.

Figure 28:
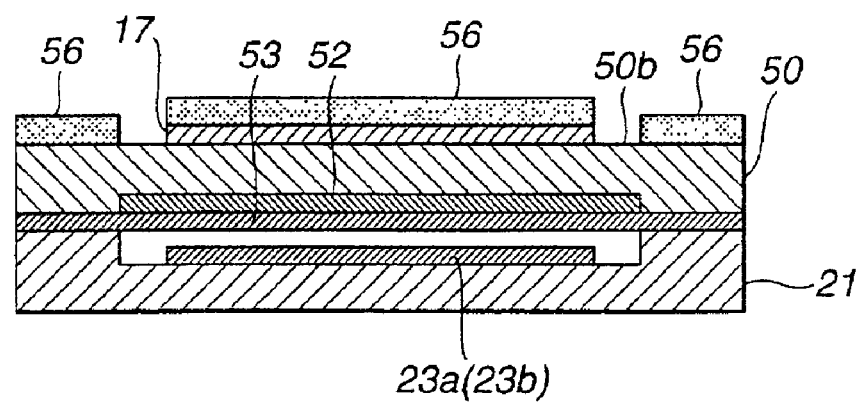
FIG. 28 is a sectional view explaining the process for production of another micro mirror unit, showing a step at which a resist pattern is formed on the Si substrate material having the mirror surface formed therein as in FIG. 27.

At a step shown in FIG. 28, the photolithography is used to form a resist pattern 56 on the other main side 50b of the Si substrate material 50 on which the mirror surface 17 is formed. The resist pattern 56 is used as a mask to shape the Si substrate material 50 correspondingly to the frame 11 and mirror substrate 14 which are to be separated from each other.

Next, the resist pattern 56 is used to etch the Si substrate material 50 by the so-called Bosch process, thereby forming the frame 11 and mirror substrate 14. In the production process, the Si substrate material 50 will be etched at a high speed but the $SiO_2$ layer 52 formed on the one main side 50a of the Si substrate material 50 will be little etched. Therefore, when the Si substrate material 50 has been etched in the direction of its thickness to the $SiO_2$ layer 52, the etching will end. Namely, the $SiO_2$ layer 52 will function as an etching stopper at this step.

Figure 29:
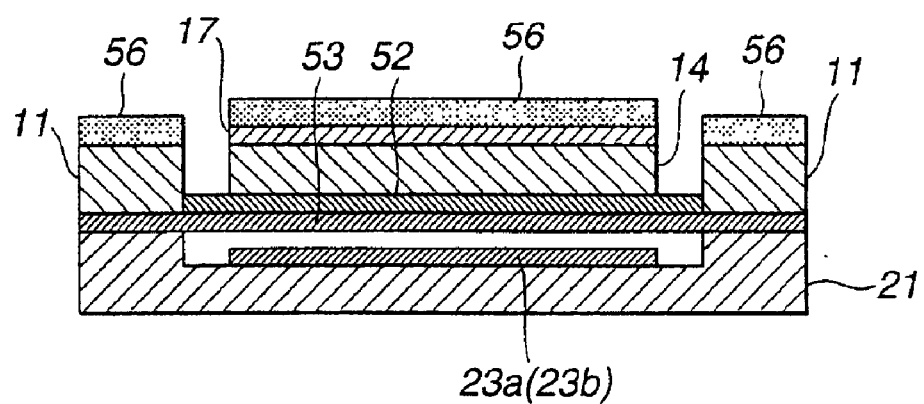
FIG. 29 is a sectional view explaining the process for production of another micro mirror unit, showing a step at which the Si substrate material is dry-etched using the resist pattern in FIG. 28 as a mask.
Figure 30:
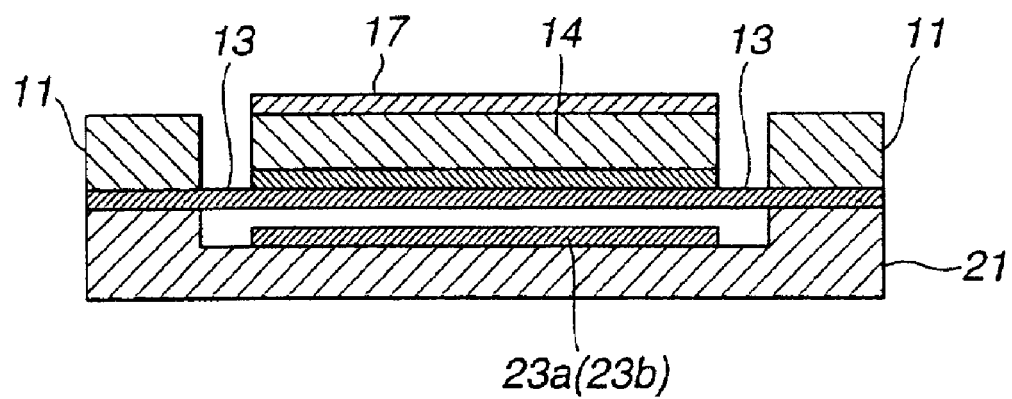
FIG. 30 is a sectional view explaining the process for production of another micro mirror unit, showing a step at which the micro mirror unit is completed by removing the $SiO_2$ layer exposed outside by dry etching of the Si substrate material as in FIG. 29.

When the dry etching of the Si substrate material 50 is done by the Bosch process or the like with the $SiO_2$ layer 52 being as the etching stopper, the frame 11 and mirror substrate 14 are formed separately as shown in FIG. 29. Next, and the micro mirror unit 1 is completed. The portions of the $SiO_2$ layer 52, exposed outside when the frame 11 and mirror substrate 14 are separated from each other, are removed by the washing using HF and further the resist layer or pattern 56 is removed. Thus, the micro mirror unit using the hinges 13 formed from the doped Si layer 53 is completed as shown in FIG. 30.

As having been described in the foregoing, according to the present invention, the hinges of the micro mirror unit are formed from a different material from the substrate material from which the frame and mirror body are formed. So, a variety of producing processes can selectively be adopted as necessary. For example, the hinges can be formed by the dry etching, not by the wet drying. Therefore, the hinges can be shaped to micro dimensions with a high precision, and the micro mirror unit thus produced can perform a high performance as a micro-motion actuator used in an optical disc drive for example.

Also, using a material superior in mechanical strength such as $SiN_x$ or the like, the hinges of the micro mirror unit can be formed to be sufficiently resistant against the pivoting of the mirror body and thus can effectively be prevented from being damaged.

Further, according to the present invention, the micro mirror unit having the high performance as in the above can be produced efficiently in a short time.

What is claimed is:

1. A method for producing a micro mirror unit comprising a frame and a mirror substrate, formed from a single substrate material, the mirror body having a mirror surface thereof formed on the mirror substrate being linked to the frame by means of hinges in such a manner that the mirror body is supported movably in relation to the frame, comprising:

a first step at which a material for the hinges are formed as layer on one main side of a substrate material for the frame and mirror substrate;

a second step at which a resist layer is formed on the other main side of the substrate material on which a mirror surface is formed; and a third step at which the frame and mirror substrate are separated from each other by the dry etching using the resist layer as a mask.

2. The method as set forth in claim 1, wherein a material different in selection ratio to etching from the substrate material is used as a material for the hinge formed as a layer on the one main side of the substrate material at the first step; and the material for the hinges are dry-etched as an etching stopper at the third step.

3. The method as set forth in claim 1, wherein a material for the hinge different in selection ratio to etching from the substrate material is formed as a layer on the one main side of the substrate material at the first step; and a material different in selection ratio to etching from the substrate material is dry-etched as an etching stopper at the third step.

4. The method as set forth in claim 1, wherein a plasma CVD process is used to form the material for the hinge as a layer at the first step.

5. The method as set forth in claim 1, wherein the dry etching is effected by supplying $SF_6$ gas and $CF_4$ gas alternately as etching gases at the third step.

* * * * *